United States Patent [19]
Janko

[11] Patent Number: 5,872,711
[45] Date of Patent: Feb. 16, 1999

[54] LOW IMPEDANCE CONTOURED LAMINATED BUS ASSEMBLY AND METHOD FOR MAKING SAME

[75] Inventor: Steven P. Janko, Chesterland, Ohio

[73] Assignee: Reliance Electric Industrial Company, Cleveland, Ohio

[21] Appl. No.: 9,441

[22] Filed: Jan. 20, 1998

[51] Int. Cl.$^6$ .............................. H02M 1/10; H01B 5/00
[52] U.S. Cl. ..................... 363/144; 361/611; 174/72 B
[58] Field of Search ................................. 363/132, 137, 363/141, 144; 361/306.1, 132, 601, 605, 611, 637; 307/147, 148; 174/72 B, 88 B, 99 B, 129 B, 133 B

[56] References Cited

U.S. PATENT DOCUMENTS

| | | | |
|---|---|---|---|
| 3,895,285 | 7/1975 | Bardahl et al. | 363/144 |
| 4,224,663 | 9/1980 | Maiese et al. | 363/144 |
| 4,346,257 | 8/1982 | Moss et al. | 174/72 B |
| 4,599,486 | 7/1986 | Herrandez . | |
| 5,172,310 | 12/1992 | Deam et al. | 363/144 |
| 5,313,363 | 5/1994 | Arbanas . | |
| 5,365,424 | 11/1994 | Deam et al. | 363/144 |
| 5,388,028 | 2/1995 | Arbanas . | |
| 5,517,063 | 5/1996 | Schantz, Jr. et al. . | |
| 5,521,811 | 5/1996 | Levran et al. . | |
| 5,579,217 | 11/1996 | Deam et al. | 363/144 |
| 5,623,399 | 4/1997 | Ishii et al. | 363/132 |

OTHER PUBLICATIONS

A Low Inducance, Simplifed Snubber, Power Inverter Implementation, Christopher A. Dimino, Ravi dodballapur, James A. Pomes, Magna Tek Drives and Systems Division, Apr. 1994, pp. 502–508.

*Primary Examiner*—Adolf Deneke Berhane
*Attorney, Agent, or Firm*—Michael E. Hudzinski; John M. Miller; John J. Horn

[57] ABSTRACT

A curved low impedance laminated bus assembly includes a curved first sheet of relatively thin conductive material forming an AC bus conductor and a curved second sheet of relatively thin conductive material forming a –DC bus conductor directly connected to a –DC line side of a DC energy storage device. A curved third sheet of relatively thin conductive material forms a +DC bus conductor directly connected to a +DC line side of the DC energy storage device and is connected to the AC bus conductor through a +DC switch. A plurality of dielectric sheets are laminated between the AC bus conductor, the –DC bus conductor, and the +DC bus conductor. A method of making the low impedance laminated bus assembly includes providing a first substantially planar sheet of relatively thin conductive material forming an AC bus conductor, providing a second substantially planar sheet of relatively thin conductive material forming a –DC bus conductor, providing a third substantially planar sheet of relatively thin conductive material forming a +DC bus conductor, providing plurality of dielectric sheets, stacking said plurality of dielectric sheets between said AC bus conductor, said –DC bus conductor, and said +DC bus conductor to form a laminated bus structure having alternating conductive and non-conductive layers. Lastly, the laminated bus structure is bent from a first substantially planar shape to a second curved shape.

19 Claims, 7 Drawing Sheets

LOW IMPEDANCE CONTOURED LAMINATED BUS ASSEMBLY AND METHOD FOR MAKING SAME

CROSS-REFERENCE TO RELATED APPLICATIONS

This application is related to my co-pending application filed concurrently with this application and assigned to the same assignee as this application entitled "Heat Sink Apparatus and Method for Making Same."

BACKGROUND OF THE INVENTION

The subject invention is directed toward the art of electric bus bar assemblies and, more particularly, to the art of low impedance laminated bus bars of the type used in electronic power conversion circuits.

The invention is especially useful in the electric variable speed motor drive industry as a low impedance bus arrangement for inverters and will be described with reference thereto; however, the invention could be used in other environments and for many different purposes.

Prior high power laminated bus assemblies for electrical switching converters have typically comprised substantially planar laminated bus structures. An example of one such structure is described in U.S. Pat. No. 5,365,424 to Deam, et al. The structure described there includes a plurality of dielectric layers interposed between flat conductive layers. Three flat AC bar conductors are arranged in the same conductive layer as a mid-point bus connecting a plurality of capacitors. A –DC bar conductor is stacked on the AC bar conductors and mid-point bus but separated therefrom with a dielectric layer made of G-10 material. A substantially flat +DC bar conductor is arranged on the –DC bar conductor and spaced therefrom by a similar dielectric layer formed of G-10 material.

The Deam, et al. patent described briefly above is typical of the many high power laminated bus assemblies available for electrical switching converters. In general, the prior art laminated bus assemblies are quite limited both mechanically and electrically due mainly to the flat conductive layers. In that regard, subsequent to the flat conductive layers being laminated together, it has heretofore been impossible to bend, form, or otherwise work the laminated structure without disturbing the mechanical and electrical integrity of the dielectric layers interposed between the respective conductive layers. Therefore, prior art laminated bus assemblies such as the one shown in Deam, et al. have been constrained to a flat or planar configuration.

While these prior designs are generally satisfactory, its is desirable to bend the laminated bus structure into various contoured configurations in order to save space and to lend flexibility to the power converter design. In addition, it is desirable to provide a contoured electric bus bar which has an inherently low impedance characteristic so as to not require additional passive "snubber" circuits.

SUMMARY OF THE INVENTION

The subject invention provides an improved contoured laminated electric bus bar for the purposes described that offers substantial advantages relative to the prior designs. The subject invention provides a snubberless contoured laminated electric bus bar which is bendable into a plurality of multi-dimensional forms without disturbing the mechanical or electrical integrity of the dielectric layers interposed between the conductive layers forming the electric bus bar.

In accordance with the subject invention, there is provided a curved low impedance laminated bus assembly for use with a power converter having a plurality of –DC and +DC switch pairs for converting between DC power to AC power on an AC power line. The laminated bus assembly generally comprises a first curved sheet of a relatively thin conductive material forming an AC bus conductor. The laminated bus assembly further includes a curved second sheet of relatively thin conductive material forming a –Dc bus conductor. A curved third sheet of relatively thin conductive material is included forming a +DC bus conductor. Lastly, the curved low impedance laminated bus assembly includes a plurality of dielectric sheets laminated between the AC bus conductor, the –DC bus conductor, and the +DC bus conductor.

In its preferred form, the curved low impedance laminated bus assembly includes a plurality of bendable polyethylene dielectric sheets having a thickness of about 0.010 inches. The preferred curved low impedance laminated bus assembly is adapted to be selectively bent from a first shape into a second arcuate or contoured shape.

In accordance with another aspect of the invention, there is provided a method of making a low impedance laminated bus assembly which is particularly well adapted for use with a power converter having a switch pair including a –DC switch and a +DC switch for switching to convert between DC power from a DC energy storage device that has a +DC line side and a –DC line side to AC power on an AC power line. The method generally includes providing a first substantially planar sheet of relatively thin conductive material forming an AC bus conductor. The method further includes providing a second substantially planar sheet of relatively thin conductive material forming a –DC bus conductor adapted for direct connect to the –DC line side of the DC energy storage device and for connection to the AC bus conductor through the –DC switch. In another step, a third substantially planar sheet of relatively thin conductive material is provided forming a +DC bus conductor adapted for direct connection to the +DC line side of the DC energy storage device and for connection to the AC bus conductor through the +DC switch. A plurality of dielectric sheets are provided which are stacked with the plurality of relatively thin conductive material sheets to form a laminated bus structure having alternating conductive and non-conducting layers. Lastly, the laminated bus structure is bent from a first substantially planar shape into a second curved or arcuate shape.

As can be seen from the foregoing, the primary object of the present invention is the provision of a bendable laminated bus assembly which is readily adaptable for connection to the power section an electrical switching converter. The bending of the laminated bus assembly saves space and provides easier connection to the various integrated circuits and electronic devices comprising the power converter.

A still further object is the provision of a bendable laminated bus assembly which does not require additional components commonly referred to as "snubbers."

Still yet a further object of the present invention is the provision of a method of forming a low impedance laminated bus assembly wherein the resulting product constitutes a single unitary structure for use in the power section of an electrical switching converter.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts, preferred embodiments and methods of which will be described in detail in this specification and illustrated in the accompanying drawings which form a part hereof, and wherein:

FIG. 7a is a top elevational view showing a second embodiment of the laminated bus assembly formed in accordance with the subject invention in a second power section of a variable speed electric motor drive; and, FIG. 7b is a side elevational view of the second embodiment of the laminated bus assembly shown in FIG. 7a.

DETAILED DESCRIPTION OF THE PREFERRED EMBODIMENTS

Figure 1A:
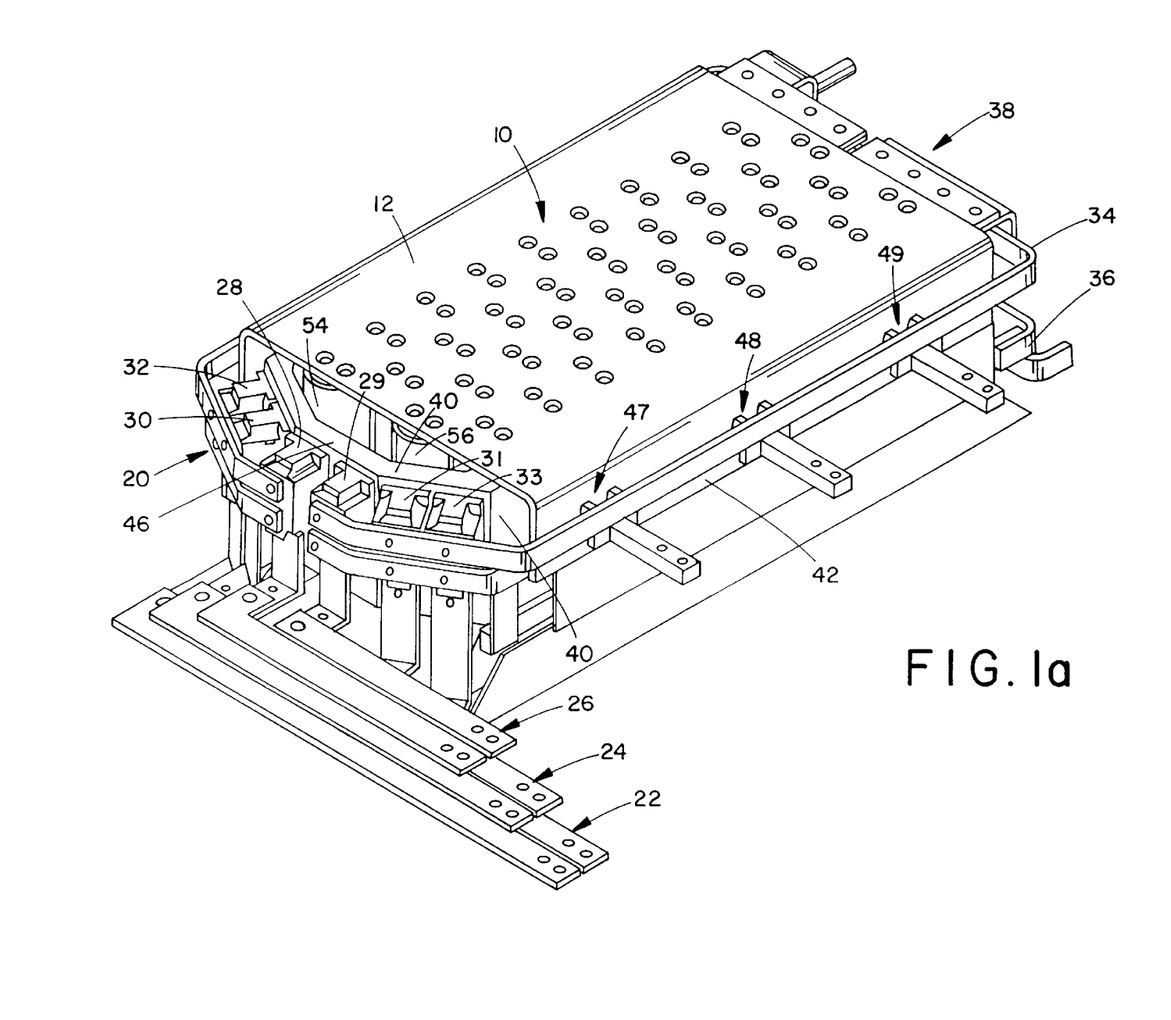
FIGS. 1a and 1b are isometric views showing a first embodiment of the laminated bus assembly formed in accordance with the subject invention in a power section of a variable speed electric motor drive.
Figure 1B:
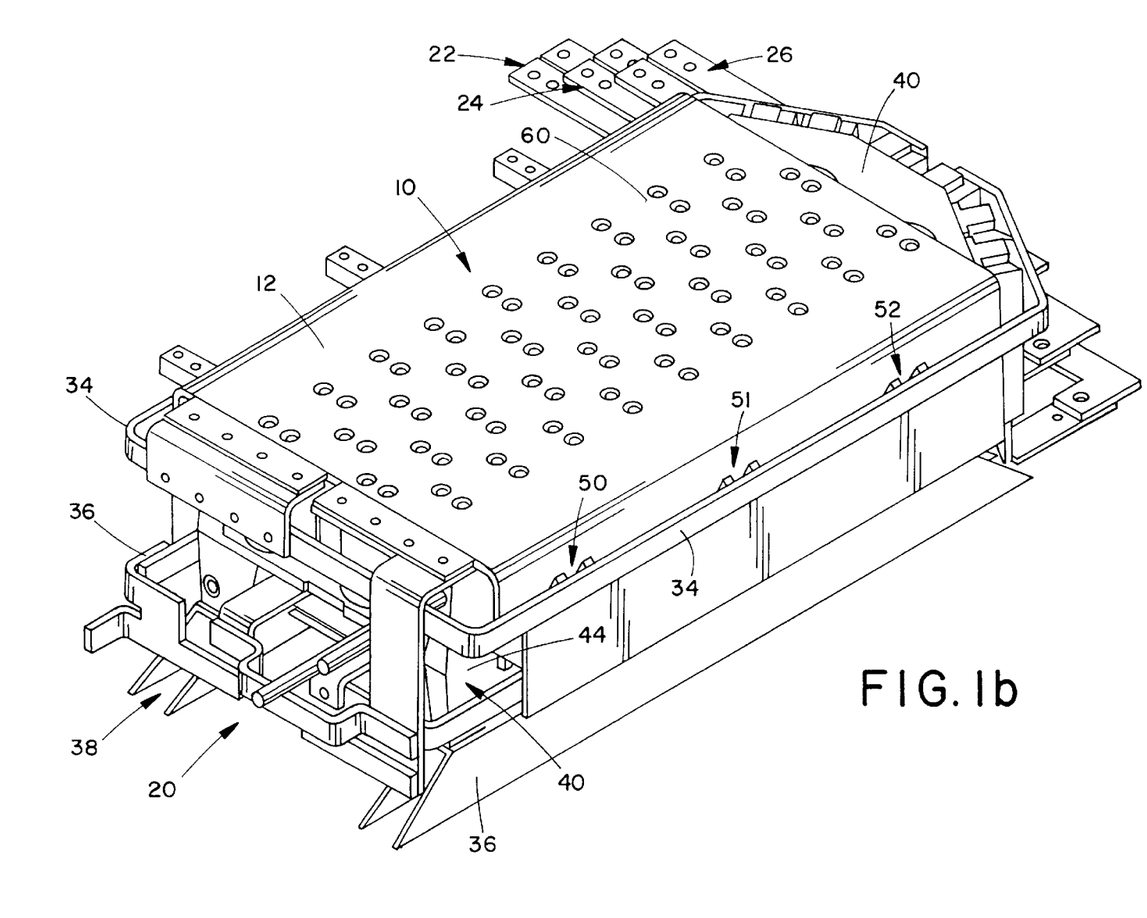

Turning now to the drawings wherein the showings are for the purposes of illustrating the preferred embodiments of the invention only and not for purposes of limiting same, FIGS. 1a and 1b illustrate a low impedance laminated bus assembly 10 formed in accordance with a first preferred embodiment of the invention and generally comprising a contoured electric bus bar 12 formed by first bonding alternating sheets of relatively thin conductive material with sheets of relatively thin non-conductive material and then mechanically bending the laminated structure into the shape generally illustrated.

As shown, the first preferred embodiment is adapted for use as part of a power section 20 of an electronic inverter drive of the type controlling the variable speed of an industrial electric motor by transforming three-phase fixed frequency input power into three-phase output signals having variable frequency and variable amplitude. Generally, the three-phase fixed frequency and fixed amplitude input power is received into the power section 20 on a set of input power bus members 22, 24, 26 as illustrated. A first phase of the input power signal is delivered to the anodes of a first pair of SCR's 28, 29 in a manner as shown. Similarly, the second and third phases of the input power signal on bus members 24 and 26 are delivered to the anodes of second and third pairs of SCR's 30, 31 and 32, 33 respectively as illustrated. Appropriate control signals are applied to the gates of the SCR's 28–33 in a well-known manner to control the three-phase input power into a +DC signal on a +DC supply bar lead 34 and a –DC signal on a –DC supply bar lead 36. In the first preferred embodiment illustrated, the input power is three-phase 720V, 60 Hz and the +DC and –DC signal levels are +720VDC and –720VDC respectively. The +DC supply bar lead 34 and the –DC supply bar lead 36 extend along the power section 20 to a back side 38 thereof opposite the area including the SCR pairs 28–33 for connection to DC bus conductors formed in the contoured electric bus bar of the present invention.

The contoured electric bus bar 12 of the first preferred embodiment is shown in the FIGURES used in combination with a first preferred embodiment of a novel cold plate assembly 40 which is the subject of my co-pending application filed concurrently with this application and assigned to the same assignee as this application, the teachings of which are incorporated herein by reference. Overall, however, the cold plate 40 includes a substantially flat base plate (not shown) at the bottom of the power section and a generally vertically extending horseshoe shaped mounting wall including a pair of spaced apart opposing vertical side walls 42, 44 and a prismatic vertical end wall 46 formed on one end of the base plate between the vertical side walls. The prismatic vertical end wall 46 provides a surface for mounting and cooling the first through third SCR's 28–33. Similarly, the vertical side walls 42, 44 provide a surface for mounting and cooling a set of electronic +DC switching elements 47, 48, 49 and a set of electronic –DC switching elements 50, 51, 52. IGBTs are typically used as the switching elements 47–52.

The cold plate assembly 40 and the contoured electric bus bar 12 of the present invention are formed around a plurality of –DC bank capacitors 54 and a plurality of +DC bank capacitors 56 in a manner shown to reduce the overall size of the power section 20. The contoured electric bus bar 12 forms a lid-like arrangement over the cold plate assembly 40 covering the capacitors between the vertical side walls 42, 44. The plurality of –DC bank capacitors 54 and the plurality of +DC bank capacitors 56 are supported from overhead by the contoured electric bus bar 12 in a manner generally as shown, the details of which will be subsequently described.

It is an advantage of the laminated bus bar assembly 10 of the present invention that the composite laminated structure is bendable and worked into any desired shape without affecting the electrical or mechanical integrity of the layers forming the bus bar assembly. As illustrated best in FIG. 2, the contoured electric bus bar 12 has a substantially planar main body portion 60 and a pair of lateral side walls 62, 64 that are each connected to the main body portion 60 by respective arcuate or contoured sections 66, 68. The contoured sections 66, 68 and the lateral side walls 62, 64 are shaped and contoured to surround the vertical side walls 42, 44 of the cold plate assembly 40 in a manner illustrated in FIGS. 1a and 1b. The length of the contoured bus bar is selected to substantially correspond to the length of the cold plate assembly as illustrated. Likewise, the width of the contoured bus bar is selected to substantially correspond to the width of the cold plate plus the width of the pair of opposing sets of IGBTs mounted on the side walls 42, 44 thereon. In that manner, a first set of IGBTs 47, 48, 49 are mechanically and thermally connected on one side to a vertical side wall 42 of the cold plate assembly 40 and are mechanically and electrically connected on the other side to a vertical side wall 62 of the contoured electric bus bar 12. Likewise, the second set of IGBTs 50, 51, 52 are mechanically and thermally connected on one side to a second vertical wall 44 of the cold plate assembly 40 and are mechanically and electrically connected on the other side to a vertical side wall 64 of the contoured electric bus bar 12. The first set of +DC switching elements (IGBTs) 47–49 are electrically connected to the second set of –DC switching elements (IGBTs) 50–52 through three separate AC bus conductors 70, 72, 74 formed of sheets of relatively thin conductive material as best illustrated in FIG. 3.

With reference now to that FIGURE, each of the AC bus conductors 70, 72, 74 forming the laminated and bent contoured electric bus bar 12 respectively includes a substantially flat main body portion 76, 78, 80 collectively defining a first conductor plane, a second body portion 82, 84, 86 collectively defining a second conductor plane non-parallel with the first conductor plane, and a third body portion 88, 90, 92 collectively defining a third conductor plane non-parallel with the first conductor plane.

In the preferred form illustrated, each of the AC bus conductors 70, 72, 74 are substantially identically formed. Accordingly, it is intended that the description of the first AC bus conductor 70 be equally applicable to the second and third AC bus conductors 72, 74 unless otherwise noted.

Figures 3, 5:
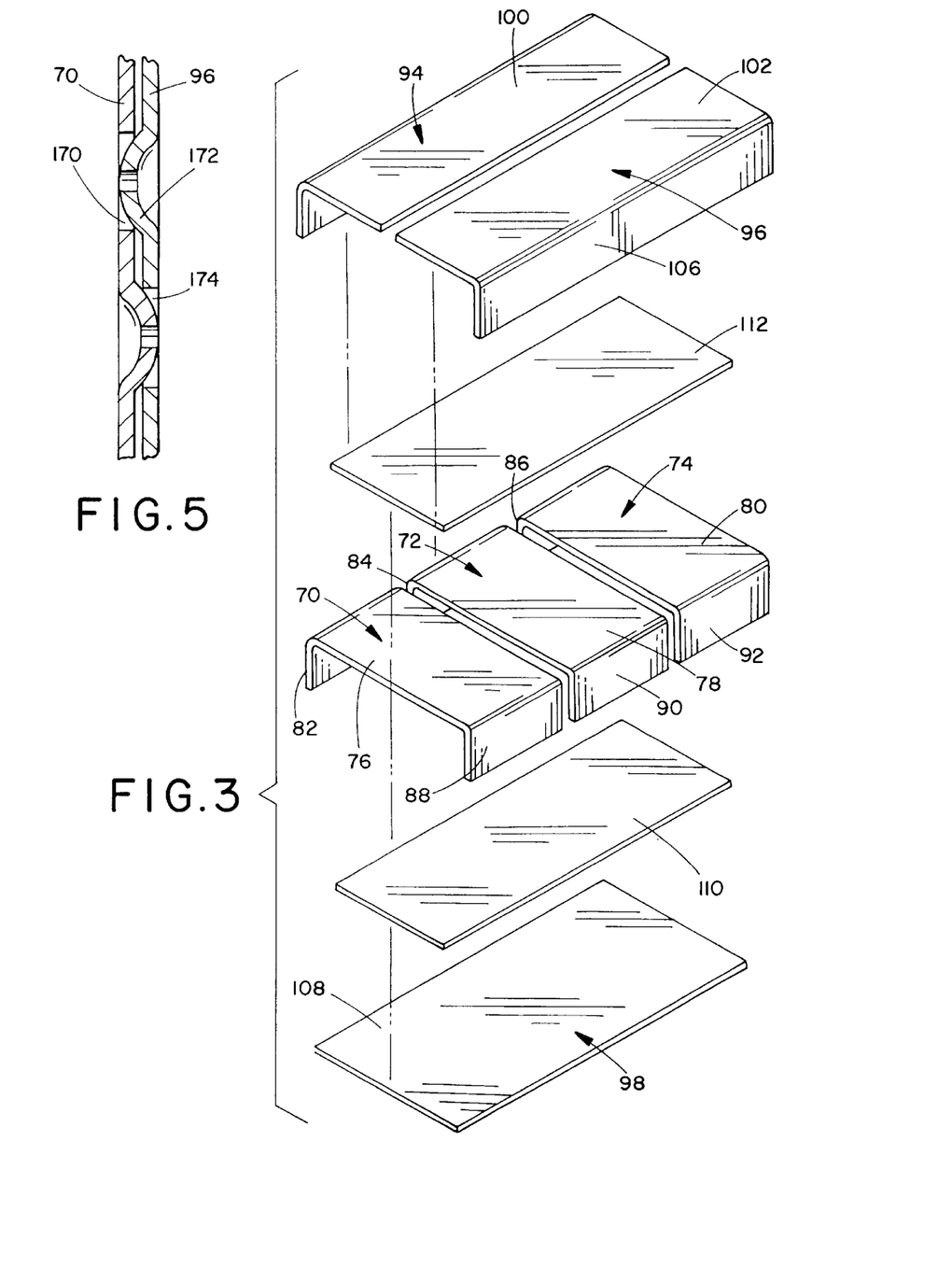
FIG. 3 is an exploded view of the first embodiment of the subject laminated bus assembly shown in FIG. 2.
FIG. 5 is a cross-sectional view of the first embodiment of the subject laminated bus assembly taken along line 5—5 in FIG. 2.

Also as shown in FIG. 3, the contoured electric bus bar 12 includes a −DC bus conductor 94, a +DC conductor 96 and a mid-point voltage bus conductor 98. The −DC bus conductor 94 includes a substantially flat main body portion 100 defining a fourth conductor plane substantially parallel to the first conductor plane, and a substantially flat second body portion 102 defining a fifth conductor plane substantially parallel to the second conductor plane. The +DC bus conductor 96 includes a substantially main body portion 104 disposed in the fourth conductor plane defined by the main body portion 100 of the −DC bus conductor 94, and a substantially flat second body portion 106 defining a sixth conductor plane substantially parallel with the third conductor plane. Preferably, the second, third, fifth and sixth conductor planes are parallel with each other. Also, in the preferred embodiment illustrated, the first and fourth conductor planes are parallel with each other and, further, are parallel with a seventh conductor plane defined by the substantially flat main body portion 108 of the mid-point voltage bus conductor 98.

The set of AC bus conductors 70, 72, 74 are arranged to be stacked between the mid-point voltage bus conductor 98 and the pair of DC bus conductors 94, 96 substantially as shown in FIG. 3. In that regard, a first thin sheet of a non-conductive dielectric material 110 is disposed between the mid-point voltage bus conductor 98 and the set of AC bus conductors 70, 72, 74. Similarly, a second thin sheet of a non-conductive dielectric material 112 is disposed between the pair of DC bus conductors 94, 96 and the set of AC bus conductors 70, 72, 74.

It is to be understood that the first and second sheets of dielectric material 110, 112 are illustrated in a generally flat configuration but that the sheets generally take on the contoured configuration of the conductive members 70–74 and 94–98 shown in the FIGURE in their bent configurations. The method of making the contoured electrical bus bar of the present invention will be subsequently described in detail but generally includes the steps of providing substantially flat sheets of conductive 70–74, 94–98 and non-conductive 110, 112 material, stacking the sheets in alternating layers of conductive 70–74, 94–98 and non-conductive 110, 112 material into a laminated bus structure, and then bending the laminated bus structure from a first substantially planar shape to a curved, or arcuate shape as shown. After the conductive and non-conductive sheets are stacked and bent, the first thin sheet of dielectric material 110 provides an interface between the first conductor plane defined by the set of AC bus conductors 70, 72, 74 and the seventh conductor plane defined by the mid-point voltage bus conductor 98. In a similar fashion, after the conductive and non-conductive sheets are stacked and bent, the second thin sheet of non-conductive dielectric material 112 provides an interface between the first, second and third conductor planes defined by the set of AC bus conductors 70, 72, 74 and the fourth, fifth and sixth conductor planes defined by the pair of DC bus conductors 94, 96.

Figure 4:
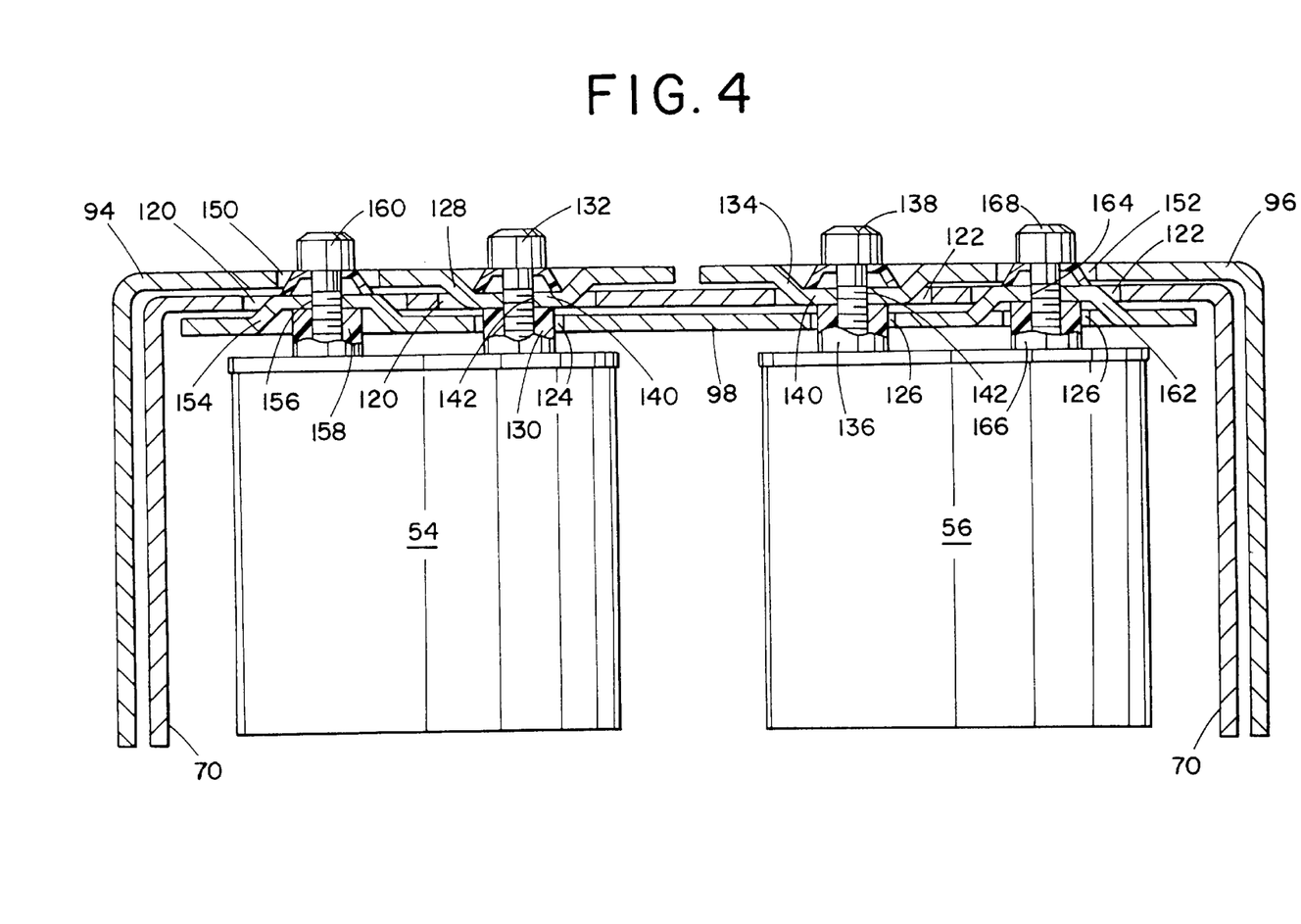
FIG. 4 is a cross-sectional view of the first embodiment of the subject laminated bus assembly taken along line 4—4 in FIG. 2.

With continued reference to FIG. 3 and with additional reference to FIG. 4, each of the AC bus conductors 70, 72, 74 include a plurality of −DC capacitor bank access holes 120 and a plurality of +DC capacitor bank access holes 122 defined in their main body portions 76, 78, 80 respectively. In addition, the mid-point voltage conductor 98 includes a plurality of first and second openings 124, 126 corresponding respectively to the plurality of −DC capacitor bank access holes 120 and the plurality of +DC capacitor bank access holes 122.

As best shown in FIG. 4, the plurality of −DC capacitor bank access holes 120 are disposed adjacent to the first openings 124 and provide access for connecting a plurality of connection tabs 128 formed on the −DC bus conductor 94 to negative terminal posts 130 extending from the plurality of −DC bank capacitors 54. The connection tabs are preferably connected to the negative terminal posts using a plurality of cap screw and disc spring washers 132 or any other suitable fasteners. As further shown in FIG. 4, the plurality of +DC capacitor bank access holes 122 are disposed adjacent to the second openings 126 and provide access for connecting the plurality of connection tabs 134 formed on the +DC bus conductor 96 to positive terminal posts 136 extending from the plurality of +DC bank capacitors 56. The connection tabs are preferably connected to the positive terminal posts using a plurality of cap screw and disc spring washers 138 or any other suitable fasteners.

The preferred form of the −DC and +DC connection tabs 128, 134 are as illustrated and include a circular indented region 140 adapted to extend toward the −DC and +DC bank capacitors respectively from the fourth conductor plane defined by the −DC and +DC bus conductors 94, 96. A circular opening 142 is located substantially at the center of the circular indented region, the opening 142 being adapted to receive the cap screws therethrough and urge the bus conductors into abutment against the terminal posts 130, 136 of the −DC and +DC bank capacitors 54, 56.

With yet continued reference to FIG. 4, the −DC and +DC bus conductors 94, 96 include a first and second plurality of mid-point connection access holes 150, 152 respectively. With regard first to the −DC bus conductor 94, the first plurality of mid-point connection access holes 150 are disposed adjacent to a corresponding plurality of first raised regions 154 formed in the mid-point voltage bus conductor 98. The first plurality of raised regions are each substantially circular in shape and include a central opening 156 adapted to receive the threaded positive terminal posts 158 of the plurality of −DC bank capacitors 54. A plurality of suitable cap screws and disc spring washers 160 are provided on the threaded terminal posts 156 to both mechanically and electrically connect the plurality of −DC bank capacitors 54 to the planar main body portion 60 of the contoured electric bus bar 12.

With regard next to the +DC bus conductor 96, the second plurality of mid-point connection access holes 152 are disposed adjacent to a corresponding plurality of second raised regions 162 formed in the mid-point voltage bus conductor 98. The second plurality of raised regions are each substantially circular in shape and include a central opening 164 adapted to receive the threaded negative terminal posts 166 of the plurality of +DC bank capacitors 56. A plurality of suitable cap screws and disc spring washers 168 are provided on the threaded terminal posts 166 to both mechanically and electrically connect the plurality of −DC bank capacitors to the planar main body portion 60 of the contoured electric bus bar 12.

Figure 2:
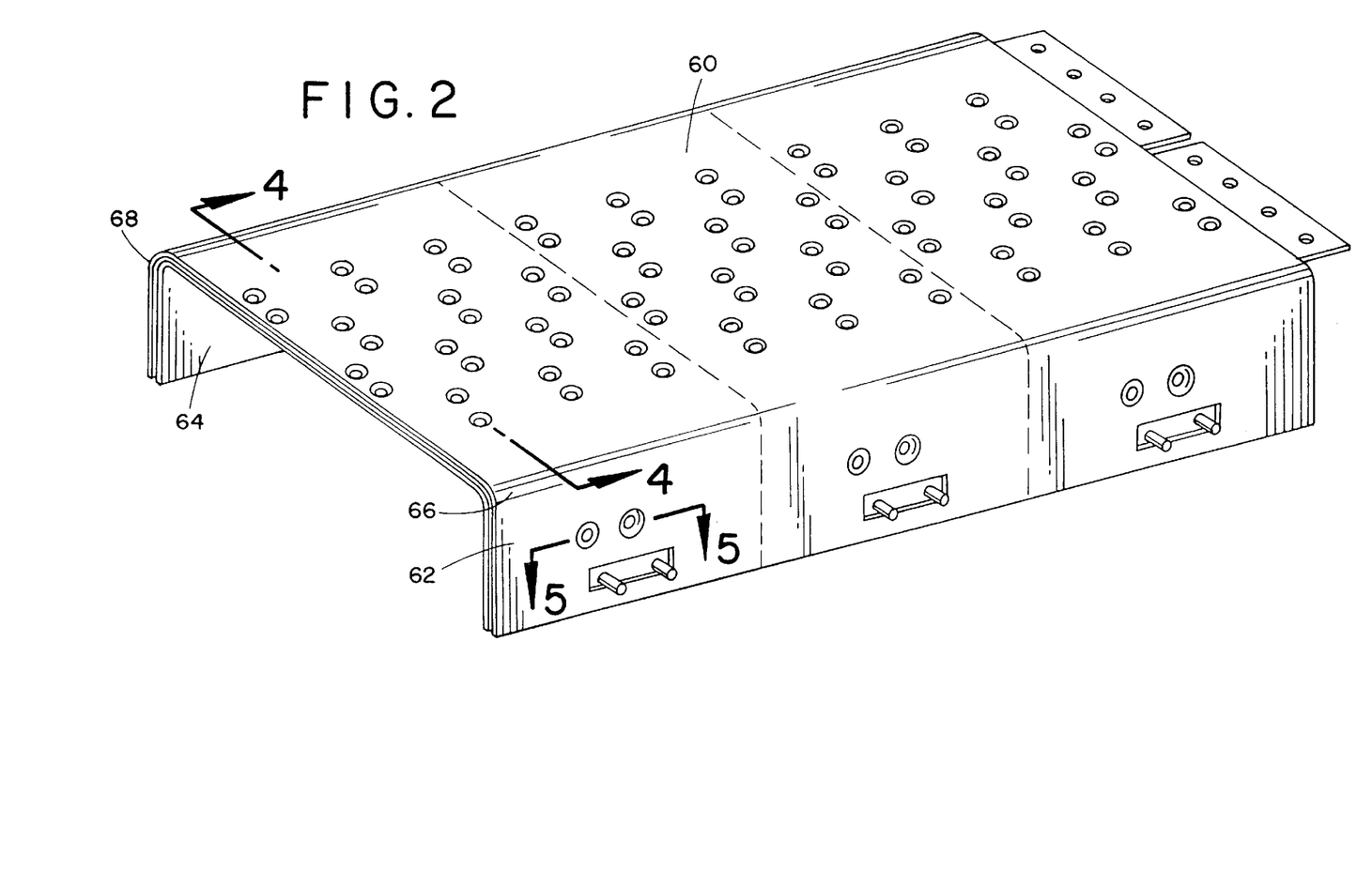
FIG. 2 is an isometric view illustrating the first embodiment of the subject laminated bus assembly shown in FIGS. 1a and 1b.

Turning now in particular to FIG. 5, but with continued reference to FIGS. 2 and 3, each of the AC bus conductors 70, 72, 74 include a backing opening 170 formed on the second and third body portions thereof, the backing openings being disposed on the AC bus conductors substantially as shown in a manner to provide a clear region adjacent a plurality of connection points 172 on the –DC and +DC bus conductors 94, 96. The plurality of connection points 172 are adapted to selectively engage the collectors or the emitters of the electronic –DC and +DC switching elements 47–52. The plurality of backing openings provide a clearance space for connection of the electronic switching element onto the contoured electric bus bar assembly 12. In that manner, various fasteners such as cap screws and disc spring washers or the like can be used which extend through the electronic switching elements and into the contoured electric bus bar assembly without making contact with the plurality of AC bus conductors 70–74.

With continued reference to FIGS. 2, 3, and 5, each of the DC bus conductors 94, 96 are provided with a set of access openings. The first set of access of openings provided on the –DC bus conductor 94 provide access to the first, second and third AC bus conductors 70, 72, 74 in order to electrically connect the electronic –DC switching elements 50, 51, 52 to the AC bus conductors 70, 72, 74. In a similar fashion, the second set of access openings 174 provide access to the AC bus conductors 70, 72, 74 to the electronic +DC switching elements 47, 48, 49.

Figure 6:
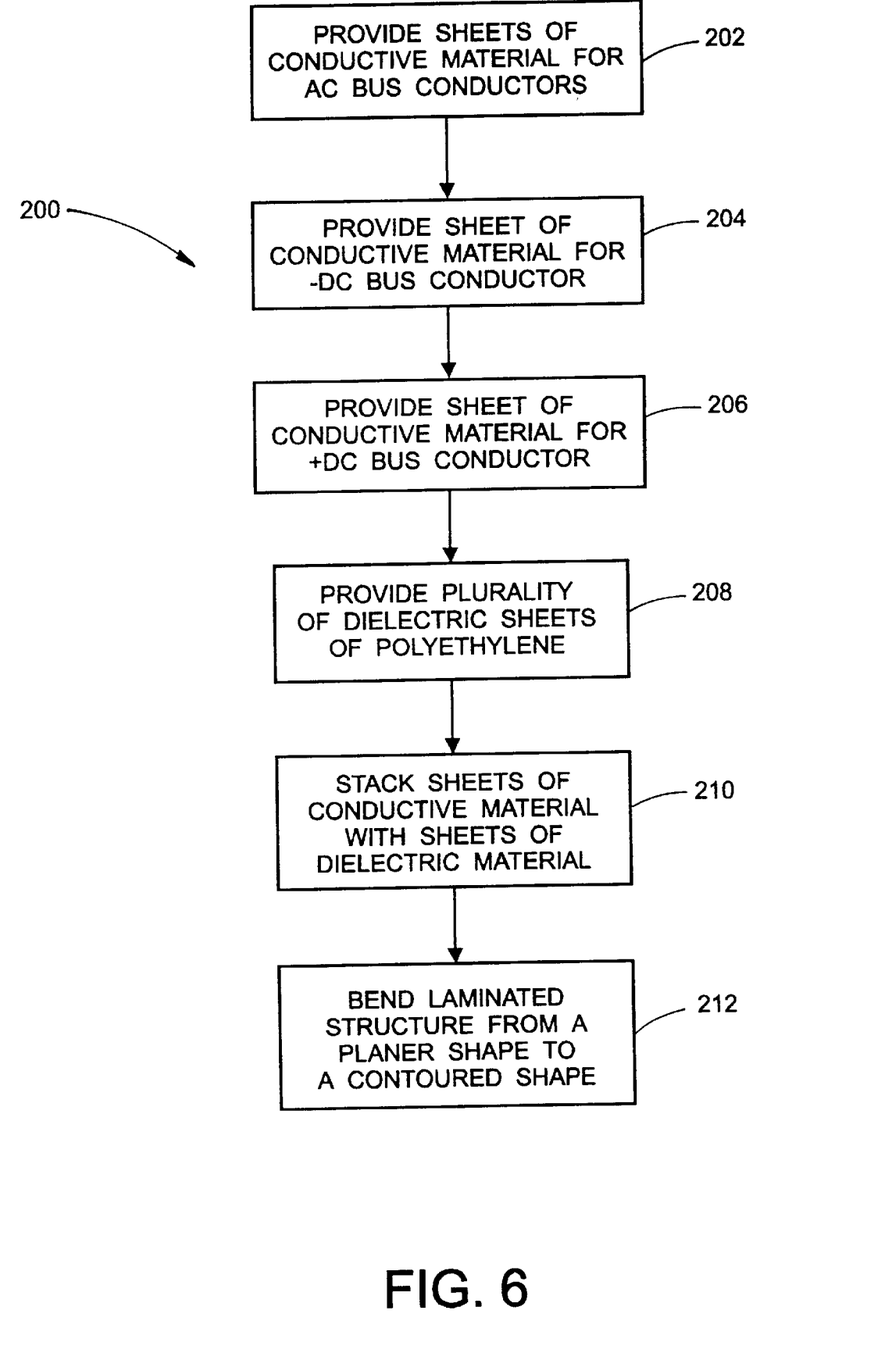
FIG. 6 is a flow chart illustrating a preferred method of manufacturing a contoured laminated electric bus bar according to the present invention.

Turning now to FIG. 6, a method 200 for manufacturing the preferred contoured electric bus bar of the present invention will be described. The method includes providing a plurality of first substantially planar sheets of a relatively thin conductive material to form a set of AC bus conductors at step 202. At step 204, a second substantially planar sheet of relatively thin conductive material is provided to form a –DC bus conductor. In the present invention, the low impedance laminated bus assembly is adapted for use with a power converter having a switch pair including a –DC switch and a +DC switch for switching to convert between DC power from a DC energy storage device that has a +DC line side and a –DC line side into AC power on a plurality of AC power lines. In that regard, the –DC bus connector provided in step 204 is adapted for direct connection to the –DC line side of the DC energy storage device and, in addition, is adapted for connection to the AC bus conductor through the –DC switch.

Next, at step 206, a third substantially planar sheet of relatively thin conductive material is provided forming a +DC bus conductor. The conductor provided at step 206 is adapted for direct connection to the +DC line side of the DC energy storage device and, in addition, is adapted for connection to the AC bus conductor provided at step 202 through the +DC switch.

Next, at step 208, a plurality of dielectric sheets, preferably formed of polyethylene having a thickness of 0.010 inches are provided. At step 210, the plurality of dielectric sheets are stacked between the AC bus conductor provided at step 202, the –DC bus conductor provided at step 204, and the +DC bus conductor provided at step 206. Thereafter, the stacked arrangement of conductive and non-conductive substantially planar layers are laminated into a laminated bus structure having alternating conductive and non-conductive layers.

Lastly, at step 212, the laminated bus structure is bent or otherwise worked from the first initially substantially planar shape into a second curved, arcuate, or contoured electric bus bar comprising the instant invention.

Figure 7A:
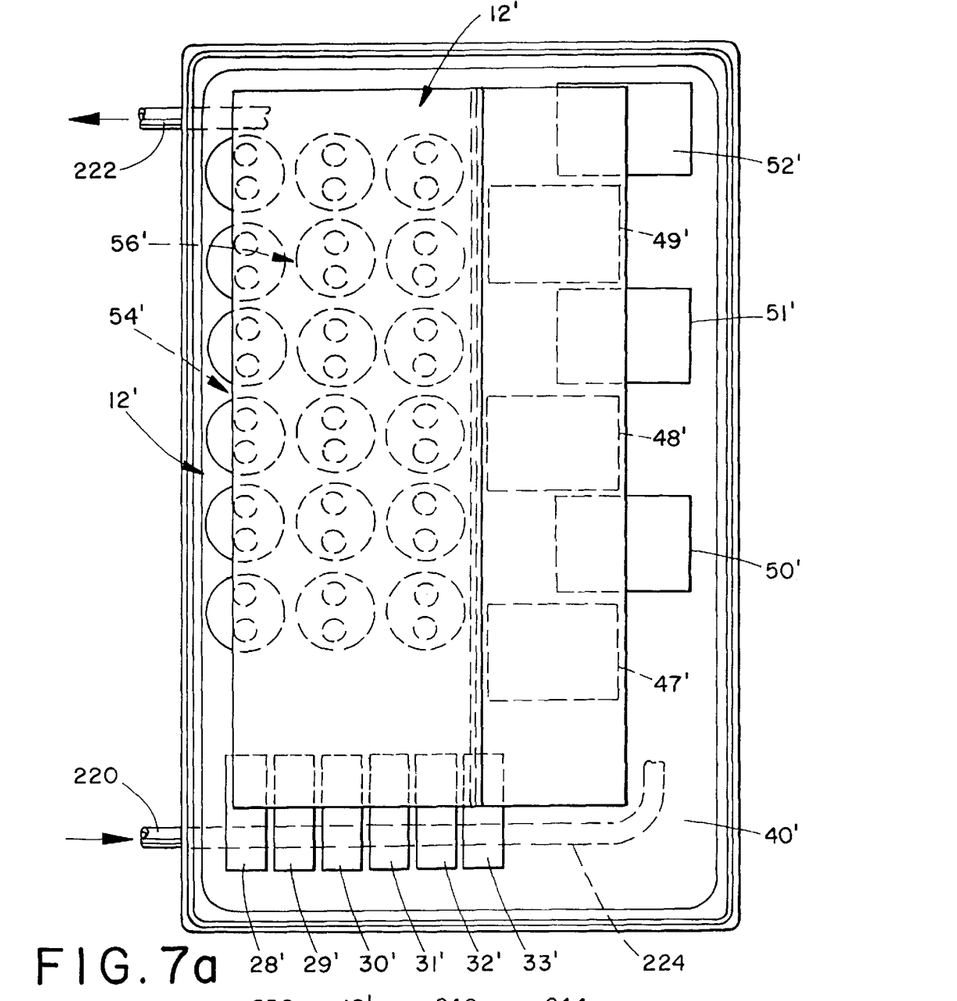
Figure 7B:
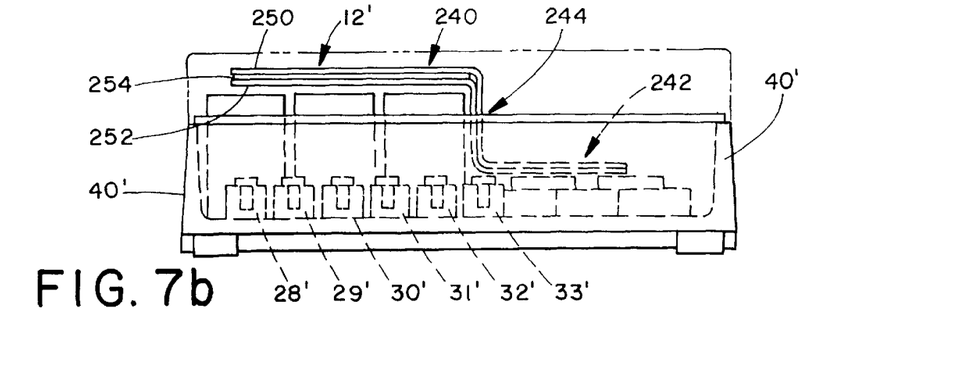

Turning next to FIGS. 7a and 7b, a second preferred embodiment of the contoured electric bus bar 12' is illustrated used together with a modified cold plate assembly 40'. The cold plate assembly forms a combined cooling apparatus and a support and housing structure for the various components comprising the power section 20' of a variable speed electronic motor drive. The modified cold plate assembly 40' includes a fluid inlet tube 220 and fluid outlet tube 222 and an intermediate coolant loop 224 (shown in phantom) for cooling various electronic components comprising the power section 40'. In the embodiment illustrated, the contoured electric bus bar 12' is formed into a substantially S-shaped configuration. In that regard, one leg of the contoured electric bus bar is connected to a plurality of –DC bank capacitors 54' and plurality of +DC bank capacitors 56'. The other leg of the electric bus bar 12' is connected to a first pair of SCR's 28', 29', to a second pair of SCR's 30', 31' and to a third pair of SCR's 32', 33'. The first, second and third pairs of SCR's serve to operate within the power section substantially as described above with regard to the first preferred embodiment of the invention to generate positive and negative DC voltages. Also connected to the second leg of the second embodiment of the contoured electric bus bar 12' are a plurality of electronic +DC switching elements 47', 48', 49' preferably IGBTs and a set of electronic –DC switching elements 50', 51', 52' also preferably IGBTs. The IGBT banks generate the necessary three phase line voltages for output from the variable frequency and variable amplitude drive.

In the embodiment illustrated in FIG. 6, the contoured electric bus bar 12' is bent into the S-shape after the plurality of conductive and non-conductive layers are laminated together into a composite laminate structure. The S-shaped laminated bus bar includes a first substantially planar horizontal region 240 adjacent the capacitors 54', 56', a second substantially planar horizontal region 242 adjacent the IGBTs 47'–52', and a vertical planar area 244 disposed alongside the first row of capacitors and interconnecting the first and second planar horizontal regions as shown. The three layers forming the first planar horizontal region 240 include a top +DC bus layer 250, a bottom –DC bus layer 252, and an intermediate midpoint voltage conductor 254. The top +DC and bottom –DC bus layers are bent as illustrated to extend into the second horizontal region 242 through the vertical planar area 244 in order to connect the IGBTs with the appropriate DC bus levels. The second horizontal region also includes a set of three AC bus conductors for delivering power from the IGBTs 47'–52' to the appropriate motor lead conductors u, v, w. The second preferred embodiment is advantageous in that the contoured electric bus bar is bent and formed to conform to the positions of the various electronic components attached to the heat sink. As such, the multi-dimensional laminated bus bar of the invention occupies only a small amount of space in the power section 20' generally as shown in the FIGURES.

The invention has been described with reference to the preferred embodiments. Obviously, modifications and alterations will occur to others upon a reading and understanding of this specification. It is intended to include all such modifications and alterations insofar as they come within the scope of the appended claims or the equivalents thereof.

Having thus described the invention, it is claimed:

1. A low impedance laminated bus assembly for use with a motor inverter that has a plurality of switch pairs, each of the plurality of switch pairs including a –DC switch and a +DC switch for high speed switching to convert between DC power from a DC energy storage unit that has a +DC line side and a –DC line side to AC power on a plurality of AC power lines, said laminated bus assembly comprising:

a plurality of AC bus conductors including an AC bus conductor for each phase of AC power, each of said plurality of AC bus conductors including a main body portion positioned in a first conductor plane, a second body portion positioned in a second conductor plane nonparallel with said first conductor plane and a third body portion positioned in a third conductor plane nonparallel with said first conductor plane;

a −DC bus conductor connected to said −DC line side of the DC energy storage unit, the −DC bus conductor including a main body portion positioned in a fourth conductor plane substantially parallel to said first conductor plane and a second body portion positioned in a fifth conductor plane substantially parallel to said second conductor plane;

a +DC bus conductor connected to said +DC line side of the DC energy storage unit, the +DC bus conductor including a main body portion positioned in said fourth conductor plane and a second body portion positioned in a sixth conductor plane substantially parallel to said third conductor plane;

a midpoint bus conductor positioned in a seventh conductor plane substantially parallel to said first and fourth conductor planes;

a first dielectric layer laminated between said first conductor plane and said seventh conductor plane; and, a second dielectric layer laminated between i) said first conductor plane and said fourth conductor plane, ii) said second conductor plane and said fifth conductor plane, and iii) said third conductor plane and said sixth conductor plane.

2. The low impedance laminated bus assembly according to claim 1 wherein each of said plurality of AC bus conductors are substantially identically shaped.

3. The low impedance laminated bus assembly according to claim 2 wherein said plurality of AC bus conductors are smoothly curved between the main body and the second body portions thereof to collectively define a first curvilinear surface.

4. The low impedance laminated bus assembly according to claim 3 wherein said plurality of AC bus conductors are smoothly curved between the main body and the third body portions thereof to collectively define a second curvilinear surface.

5. The low impedance laminated bus assembly according to claim 4 wherein:

said −DC bus conductor is disposed on a first side of each of said plurality of AC bus conductors and shaped to substantially correspond to said first curvilinear surface; and, said +DC bus conductor is disposed on said first side of each of said plurality of AC bus conductors and shaped to substantially correspond to said second curvilinear surface.

6. The low impedance laminated bus assembly according to claim 5 wherein said midpoint bus conductor is disposed on a second side of each of said plurality of AC bus conductors.

7. The low impedance laminated bus assembly according to claim 6 wherein:

said midpoint bus conductor includes: i) a first set of openings defining a first set of midpoint bus conductor through holes for connecting said −DC bus conductor to said −DC line side of said DC energy storage unit; and, ii) a second set of openings defining a second set of midpoint bus conductor through holes for connecting said +DC bus conductor to said +DC line side of said DC energy storage unit; and, wherein said plurality of AC bus conductors include: i) a third set of openings defining a first set of AC bus conductor through holes substantially adjacent said first set of midpoint bus conductor through holes for connecting said −DC bus conductor to said −DC line side of said DC energy storage device; and, ii) a fourth set of openings defining a second set of AC bus conductor through holes substantially adjacent said second set of midpoint bus conductor through holes for connecting said +DC bus conductor to said +DC line side of said DC energy storage unit.

8. The low impedance laminated bus assembly according to claim 7 wherein:

said −DC bus conductor includes a fifth set of openings defining a first set of −DC bus conductor through holes for connecting said plurality of AC bus conductors to respective −DC switches of said plurality of switch pairs; and, said +DC bus conductor includes a sixth set of openings defining a first set of +DC bus conductor through holes for connecting said plurality of AC bus conductors to respective +DC switches of said plurality of switch pairs.

9. The low impedance laminated bus assembly according to claim 8 wherein:

said first set of −DC bus conductor through holes are disposed on said second body portion of said −DC bus conductor; and, said first set of +DC bus conductor through holes are disposed on said second body portion of said +DC bus conductor.

10. The low impedance laminated bus assembly according to claim 9 wherein said first and second dielectric layers are formed of a bendable polyethylene material having a thickness of about 0.010 inches.

11. The low impedance laminated bus assembly according to claim 2 wherein:

said first and second dielectric layers include a bendable polyethylene material having a thickness of about 0.010 inches whereby the bus assembly is adapted to be selectively bent from a first shape to a second shape.

12. The low impedance laminated bus assembly according to claim 1 in combination with a motor inverter including a fluid cooled cold plate and a plurality of switch pairs connected to the cold plate, each of the plurality of switch pairs including a −DC switch and a +DC switch for high speed switching to convert between DC power from a DC energy storage unit that has a +DC line side and a −DC line side to AC power on a plurality of AC power lines.

13. A curved low impedance laminated bus assembly for use with a power converter having a switch pair including a −DC switch and a +DC switch for switching to convert between DC power from a DC energy storage device that has a +DC line side and a −DC line side to AC power on an AC power line, said laminated bus assembly comprising:

a curved first sheet of relatively thin conductive material forming an AC bus conductor;

a curved second sheet of relatively thin conductive material forming a −DC bus conductor directly connected to said −DC line side of said DC energy storage device and connected to said AC bus conductor through said −DC switch;

a curved third sheet of relatively thin conductive material forming a +DC bus conductor directly connected to said +DC line side of said DC energy storage device and connected to said AC bus conductor through said +DC switch; and, a plurality of dielectric sheets laminated between said AC bus conductor, said –DC bus conductor, and said +DC bus conductor.

14. The curved low impedance laminated bus assembly according to claim 13 wherein:

said AC bus conductor includes a first curved region;

said –DC bus conductor includes a second curved region conforming in shape to said first curved region of said AC bus conductor so that the –DC bus conductor is stackable with the AC bus conductor; and, said +DC bus conductor includes a third curved region conforming in shape to said first curved region of said AC bus conductor and to said second curved region of said –DC bus conductor so that the +DC bus conductor is selectively stackable with the AC bus conductor and the –DC bus conductor.

15. The curved low impedance laminated bus assembly according to claim 14 wherein said plurality of dielectric sheets are formed of a bendable polyethylene material having a thickness of about 0.010 inches whereby the bus assembly is adapted to be selectively bent from a first shape to a second shape.

16. The curved low impedance laminated bus assembly according to claim 13 wherein:

said AC bus conductor includes a first curved region and a second curved region;

said –DC bus conductor includes a third curved region conforming in shape to said first curved region of said AC bus conductor so that the –DC bus conductor is stackable with the AC bus conductor; and, said +DC bus conductor includes a fourth curved region conforming in shape to said second curved region of said AC bus conductor so that the +DC bus conductor is stackable with the AC bus conductor.

17. The curved low impedance laminated bus assembly according to claim 13 in combination with a motor inverter including a fluid cooled cold plate and a plurality of switch pairs connected to the cold plate, each of the plurality of switch pairs including a –DC switch and a +DC switch for high speed switching to convert between DC power from a DC energy storage unit that has a +DC line side and a –DC line side to AC power on a plurality of AC power lines.

18. A method of making a low impedance laminated bus assembly for use with a power converter having a switch pair including a –DC switch and a +DC switch for switching to convert between DC power from a DC energy storage device that has a +DC line side and a –DC line side to AC power on an AC power line, the method comprising the steps of:

providing a first substantially planar sheet of relatively thin conductive material forming an AC bus conductor;

providing a second substantially planar sheet of relatively thin conductive material forming a –DC bus conductor adapted for direct connection to said –DC line side of said DC energy storage device and for connection to said AC bus conductor through said –DC switch;

providing a third substantially planar sheet of relatively thin conductive material forming a +DC bus conductor adapted for direct connection to said +DC line side of said DC energy storage device and for connection to said AC bus conductor through said +DC switch;

providing plurality of dielectric sheets;

stacking said plurality of dielectric sheets between said AC bus conductor, said –DC bus conductor, and said +DC bus conductor to form a laminated bus structure having alternating conductive and non-conductive layers; and, bending the laminated bus structure from a first substantially planar shape to a second curved shape.

19. The method of making a low impedance laminated bus assembly according to claim 18 wherein the step of providing said plurality of dielectric sheets includes providing a plurality of sheets of bendable polyethylene material having a thickness of about 0.010 inches.

\* \* \* \* \*